United States Patent [19]

Eguchi et al.

[11] Patent Number: 4,939,556
[45] Date of Patent: Jul. 3, 1990

[54] CONDUCTOR DEVICE

[75] Inventors: Ken Eguchi; Haruki Kawada, both of Atsugi; Kunihiro Sakai, Yamato; Yoshinori Tomida; Hiroshi Matsuda, both of Atsugi; Toshiaki Kimura, Sagamihara; Kiyoshi Takimoto, Wako; Toshihiko Miyazaki, Atsugi; Yuko Morikawa, Kawasaki, all of Japan

[73] Assignee: Canon Kabushiki Kaisha, Tokyo, Japan

[21] Appl. No.: 71,393

[22] Filed: Jul. 9, 1987

[30] Foreign Application Priority Data

| Jul. 10, 1986 | [JP] | Japan | 61-160931 |
| Jul. 11, 1986 | [JP] | Japan | 61-161978 |
| Sep. 16, 1986 | [JP] | Japan | 61-217818 |
| Oct. 8, 1986 | [JP] | Japan | 61-239847 |
| Nov. 28, 1986 | [JP] | Japan | 61-282053 |

[51] Int. Cl.$^5$ .............. H01L 27/12; H01L 45/00; H01L 49/02; H01L 29/28
[52] U.S. Cl. .............. 357/4; 357/8
[58] Field of Search .............. 357/4, 8

[56] References Cited

U.S. PATENT DOCUMENTS

| 2,070,642 | 2/1937 | Becker | 175/366 |
| 3,953,874 | 4/1976 | Aviram et al. | 357/8 |
| 4,127,738 | 11/1978 | Ghosh et al. | 357/8 |
| 4,197,142 | 4/1980 | Bolton et al. | 357/8 |
| 4,205,329 | 5/1980 | Dingle et al. | 357/4 |
| 4,586,062 | 4/1986 | Boufford et al. | 357/8 |
| 4,627,029 | 12/1986 | Wilson et al. | 365/120 |
| 4,665,412 | 5/1987 | Ohkawa et al. | 357/4 |
| 4,672,265 | 6/1987 | Eguchi et al. | 313/504 |
| 4,725,513 | 2/1988 | Eguchi et al. | 429/690 |
| 4,813,016 | 3/1989 | Okada et al. | 357/8 |

FOREIGN PATENT DOCUMENTS 165111 12/1989 France .
2190792 11/1987 United Kingdom .

OTHER PUBLICATIONS

Fox, "Molecular Electronic Devices Offer Challenging Goal" Chemical and Engineering News, May 23, 1983, pp. 27–29.
CRC Handbook of Chemistry and Physics, 66th edition, 1986, pp. E–99 to E–102.
Journal of Molecular Electronics, vol, No. 1, Jul./Sep. 1985, pp. 3–17; Chichester, Sussex, G.B.
M. Sugi, "Langmuir–Blodgett Films a Course to Molecular Electronics: A Review".
Journal of Molecular Under Electronics, vol. 2, No. 3, Jul./Sep. 1986, pp. 119–124; Chichester, Sussex, G.B.
R. M. Metzgar et al.: Toward Organic Retifiers: Thin Solid Films, vol. 135; No. 2, Jan. 15, 1986, pp. 173–182, Lusanne, CH, N. R. Couch et al.: "Metallic Conduction Through Langmuir–Blodgett Films".

Primary Examiner—Eugene R. Laroche
Assistant Examiner—Michael B. Shingleton
Attorney, Agent, or Firm—Fitzpatrick, Cella, Harper & Scinto

[57] ABSTRACT

A semiconductor device is provided and which comprises a semiconductor having insulating layers and conductive layers laminated alternately. The semiconductor comprises an organic film, and electrodes are provided on the semiconductor.

36 Claims, 9 Drawing Sheets

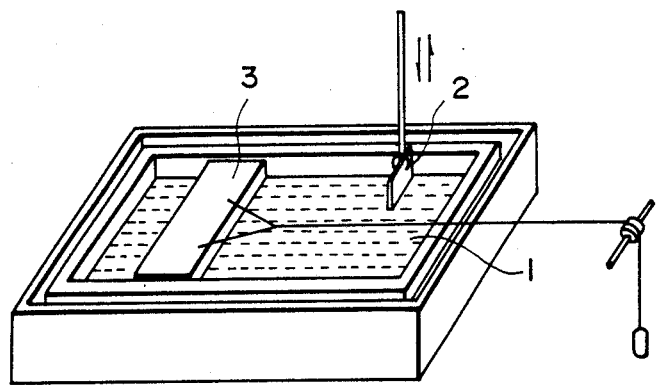
F I G. 1
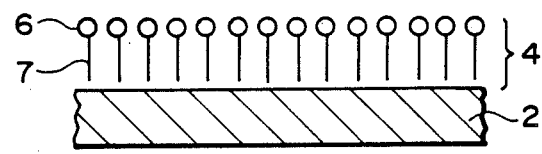
F I G. 2A
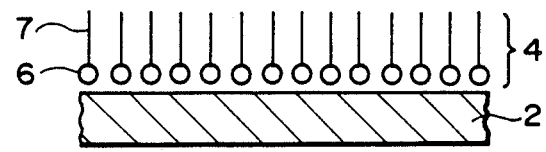
F I G. 2B

CONDUCTOR DEVICE

BACKGROUND OF THE INVENTION

1. Field of the Invention

The present invention relates to an organic semiconductor device, and particularly, to an organic semiconductor device having super-lattice structure with insulating layers and conductive layers which are repeatedly provided in an alternate fashion.

2. Related Background Art

Hitherto, the utilization of materials in the technical field of semiconductor devices and the technical field of optics has made progress solely in respect of inorganic matters which are relatively easy to handle. This is partly for the reason that the technical progress in the field of organic chemistry has been greatly behind that in the field of inorganic materials.

However, there has been surprising technical progress recently made in the field of organic chemistry, and the development on the inorganic materials is said to be almost approaching a limit. Now, it has been sought after to develop organic materials as new functional materials that can exceed the inorganic matters. Advantages of organic materials are such that they are inexpensive, can be produced with ease, and can be highly functional. On the other hand, with respect to the thermal resistance and mechanical strength that have been hitherto considered inferior, organic materials having overcome this problem, others have been recently created one after another. Under such technical background, some research institutions have recently proposed to constitute part or all of the constituents (chiefly thin film part) having the functions of integrated circuit devices such as logical elements, memories and photoelectric transducers and optical devices such as microlens arrays and optical waveguides, with use of organic thin films in place of the conventional inorganic thin films, and even proposed to produce molecular electronic devices in which one organic molecule is endowed with the function of a logical element or a memory, and logical elements comprising a living body-related substance (for example, biotips).

In more recent years, it has been disclosed that an organic metallic compound comprising tetracyanoquinodimethane (TCNQ) serving as an electron acceptor, which compound is an amphiphilic charge transfer complex having a long chain alkyl group as a hydrophobic part, such as bis-tetracyanoquinodimethane dococylpyridinium

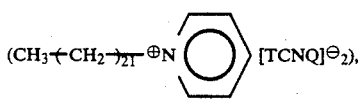

may form a monomolecular film on a water surface, and this monomolecular film may be built up layer by layer to produce a conductive monomolecular built-up film. This conductive monomolecular built-up film can be a conductive material as they show high specific conductance in the direction parallel to the film surface, but acts as an insulating material in the direction perpendicular to the film.

Such a conductive monomolecular built-up film is attracting interests from a viewpoint of, e.g., application in electronic devices as an organic super-lattice conductive material having anisotropy of very large specific conductance, but has not yet been put into such a practical use.

Semiconductor devices chiefly composed of inorganic materials may generally require expensive materials and complicated production processes such as high temperature treatment, which raise a problem that can not be satisfactorily remedied from an economical viewpoint. To solve such a problem, researches have been made semiconductor devices using organic materials, but nothing has been produced as of the present to as far as an economically constructed semiconductor device is concerned.

SUMMARY OF THE INVENTION

An object of the present invention is to construct a semiconductor device comprising an organic material according to an economical and simple process.

According to an aspect of the present invention, there is provided a semiconductor device comprising a semiconductor having insulating layers and conductive layers which are laminated alternately, and electrodes provided on said semiconductor, said semiconductor comprising an organic film.

According to another aspect of the present invention, there is provided a semiconductor device having an amplification device function, comprising insulating layers and conductive layers which are laminated alternately, a semiconductor containing at least two layers of the insulating layers, and electrodes provided on said semiconductor; said semiconductor comprising an organic film.

According to still another aspect of the present invention, there is provided a semiconductor device having switching effect, comprising an organic thin film provided between a pair of electrodes, said organic thin film comprising electrical insulating regions and conductive regions which are laminated alternately.

According to a further aspect of the present invention, there is provided a semiconductor device having a periodic lamination structure comprising organic thin films and inorganic thin films which are laminated alternately and electrodes.

According to a still further aspect of the present invention, there is provided a semiconductor device having a periodic lamination structure comprising organic thin films and inorganic thin films which are laminated alternately and electrodes, wherein the organic thin films and inorganic thin films have heterojunction, and said periodic lamination structure has a super-lattice structure comprising repetition of the heterojunction.

BRIEF DESCRIPTION OF THE DRAWINGS

FIG. 1 is a view diagramatically illustrating how to form a semiconductor layer of the semiconductor device of the present invention;

FIG. 2A and FIG. 2B are schematic views of monomolecular films;

DETAILED DESCRIPTION OF THE PREFERRED EMBODIMENTS

Figure 3A:
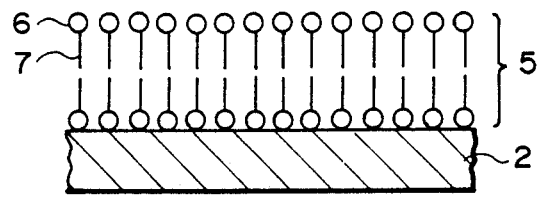
FIG. 3A to FIG. 3C are schematic views of built-up films.

The organic film constituted in the semiconductor device of the present invention may preferably be formed as a monomolecular film or monomolecular built-up film comprising a molecule having both a hydrophilic part and a hydrophobic part. Typical examples of the constituent for the hydrophobic part of the molecule may include various hydrophobic groups widely known in general, such as saturated and unsaturated hydrocarbon groups, condensed polycyclic aromatic groups and chain-like polycyclic phenyl groups. These groups may be respectively alone or in combination of a plurality of these to constitute the hydrophobic part. On the other hand, typical examples of the constituents for the hydrophilic part may include various hydrophilic groups such as a carboxyl group, a sulfonic acid group or a tertiary amino group. Any of molecules that can have these hydrophobic part and hydrophilic part in well balanced combination can form the monomolecular film on a water surface, but, in general, these molecules form a monomolecular film having an insulation property. In order to form a conductive monomolecular film, they are required to have further as an electroconductive part in combination, for example, tetracyanoquinodimethane (TCNQ), derivatives thereof, or analogues thereof, for example, 11,11,12,12-tetracyano-2,6-naphthoquinodimethane (TMAP); or tetrathiafulvalene (TTF) or derivatives thereof: or, further, tetrathiatetracene (TTT) or analogues thereof.

Examples of the above-mentioned molecule in the present invention may include, for example, the molecule as shown below.

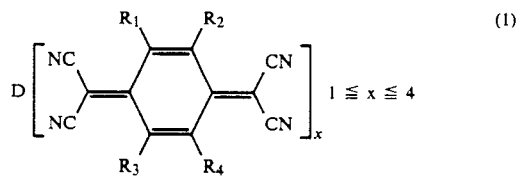

In the formula, $R_1$, $R_2$, $R_3$ and $R_4$ may be the same or different, and each represent hydrogen, chlorine, bromine or fluorine, or an alkyl group; D represents a cation having quaternary amine and may include, for example;

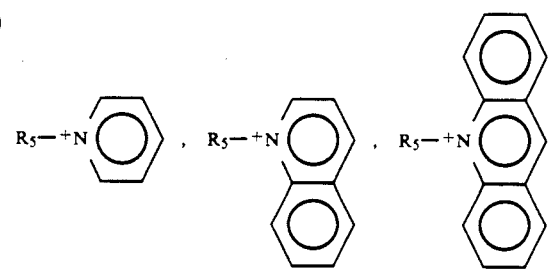

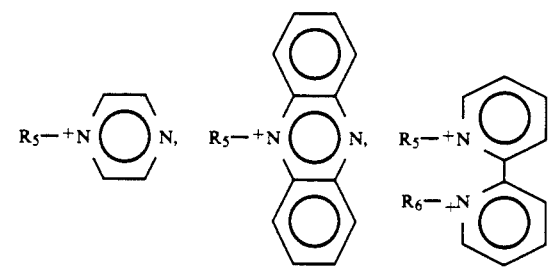

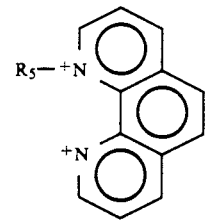

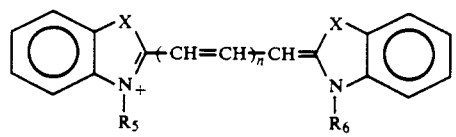

(X = O, S or Se; n = 0, 1 or 2)

Here, $R_5$ and $R_6$ each represent a long chain alkyl group having 12 to 30 carbon atoms, and may be the same or different.

There may be also included a compound represented by Formula (2):

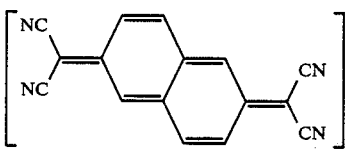

(2)

which is formed by replacing the TCNQ moiety

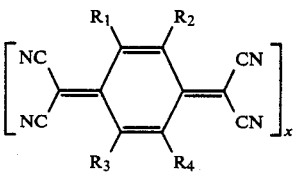

of the TCNQ derivative compound represented by the above Formula (1), with 11,11,12,12-tetracyano-2,6-naphthoquinodimethane.

The TCNQ moiety of Formula (1) may be further replaced with the compound represented by Formula (3) shown below, without providing at the D (donor) side the long chain alkyl group having 12 to 30 carbon atoms constituting the hydrophobic part.

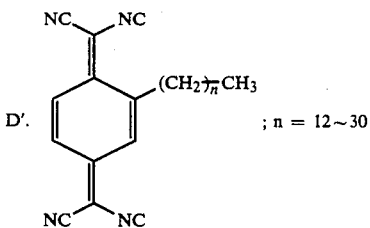

In the formula, D' represents tetrathiafulvalene, or a derivative or analogue thereof, including, for example;

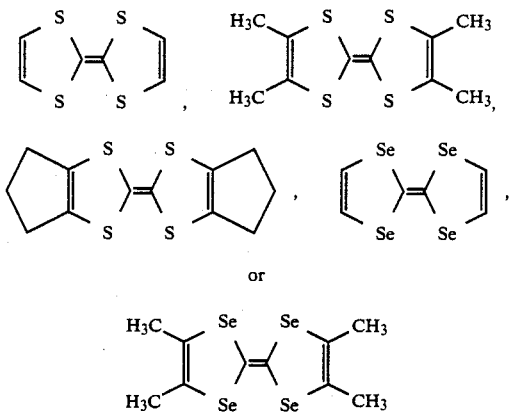

The compounds shown respectively as examples by the above Formulas (1) to (3) have both a hydrophobic part and a hydrophilic part in one molecule, and are charge transfer complexes exhibiting insulation property and electrical conductivity. Accordingly, the semiconductor device of the present invention can be formed by film formation on a substrate by using any of the charge transfer complexes as a monomolecular film or a built-up film thereof.

Particularly, in the present invention, the above organic thin film may be formed by Langmuir-Blodgett process (hereinafter "LB process") to give a monomolecular film, which monomolecular film may be provided on any substrate with the necessary electrodes formed thereon, whereby an organic semiconductor device having a number of effective features showing nonlinear current-voltage characteristics can be produced, and also a semiconductor device comprising an organic film having a high grade of orderliness and being readily formed as an ultra-thin film.

This LB process is a process for producing a monomolecular film or monomolecular built-up film by utilizing a mechanism that when hydrophilic-lipophilic balance is appropriately maintained in the molecule having the structure such that the hydrophilic part and hydrophobic part are possessed in a molecule as in the above-mentioned charge transfer complex, this molecule can form on a water surface a monomolecular layer with hydrophilic group facing downward.

The monomolecular film on a water surface has the feature of a planar system, and, when molecules are sparsely spread out, an equation of the planar ideal gas:

$$\pi A = \kappa T$$

can be established between the area per molecule (the area occupied by a molecule) A and the surface pressure $\pi$, to form a "gaseous film". Here, $\kappa$ represents the Boltzmann's constant, and T, the absolute temperature. The interaction between molecules can be strengthened by increasing the surface pressure and sufficiently minimizing the area held by molecule, to form a planar solid "condensed film (or solid film)". This condensed film finally may have a highly orderly, uniform ultra-thin film comprising molecules orderly arranged and oriented. Also, this condensed film can be transferred layer by layer onto a surface of any articles such as glass or resin having any quality and shape, and the monomolecular film may be transferred several times on the same article to obtain a monomolecular built-up film. As will be seen from the formation process, the monomolecular film or monomolecular built-up film thus obtained can be a ultra thin film having a high grade orderliness, which are suitable as a semiconductor layer in the semiconductor device of the present invention. Of course, the process for the formation of the semiconductor layer may not be limited to this LB process, and it is also possible to employ vacuum deposition or electrolytic polymerization.

A specific process for producing the semiconductor layer by use of the above LB process will be described below with reference also to the drawings.

First, desired film-forming molecules such as the charge transfer complexes as mentioned above are dissolved in chloroform benzene, acetonitrile or a mixed solvent of these. Next, using a suitable apparatus as shown in FIG. 1 of the accompanying drawings, a solution of the film-forming molecules is spread over an aqueous phase 1 to form a spreading layer on which the molecules are spread in the form of a film.

Subsequently, a partition plate (or float) 3 is provided so that this spreading layer may not be freely diffused on the aqueous phase and exceedingly spread, thereby limiting the spreading area and controlling the gathering state of film substances, to obtain the surface pressure proportional to the gathering state. Then, this partition plate is moved to reduce the spreading area to control the gathering state of the film substances, whereby the surface pressure is gradually increased so as to be set to the surface pressure π suited for the production of the film. The surface pressure may appropriately be about 15 to 30 dyn/cm.

While maintaining this surface pressure, a clean substrate 2 may be gently moved upward or downward to obtain a desired monomolecular film on the substrate 2. Such a monomolecular film can be comprised of molecules arranged orderly as schematically shown in FIG. 2A or FIG. 2B. In such a state, the mutual action between molecules adjacent to each other can be strengthened. For example, in the molecule comprising a hydrophilic part 6 having an electrical conductivity and a hydrophobic part 7 having an insulation property as in the charge transfer complex mentioned above, the TCNQ, the long chain alkyl group and so forth constituting these part are stacked in the direction parallel to the film surface to produce the electrical conductivity in the direction parallel to the film surface, and, on the other hand, the insulation property is exhibited in the direction perpendicular to the film surface, thus providing a layer suited as the semiconductor layer in the semiconductor device of the present invention.

The monomolecular film can be produced as above, and the above operations may be repeated to form the monomolecular built-up film in a desired built-up number. The monomolecular film or monomolecular built-up film can be formed on the substrate according to not only the vertical dipping process as mentioned above in which the drawing up and dipping are alternately repeated, but also a horizontal lifting process or a rotating cylinder process.

The horizontal lifting process is a process in which a substrate is horizontally brought into contact with a water surface so that a monomolecular film may be transferred onto the substrate, thereby forming the monomolecular film or monomolecular built-up film. The rotating cylinder process is a process in which a substrate of cylindrical shape is rotated on a water surface to form the monomolecular film or monomolecular built-up film.

According to the above-mentioned vertical dipping process, a substrate having a hydrophobic surface is dipped in water in the direction crossing the water surface, whereby a monomolecular built-up film in which hydrophobic groups of the molecules constituting the film have faced the substrate side can be formed on the substrate (FIG. 2A). On the other hand, a substrate having a hydrophilic surface is drawn up from water in the direction crossing the water surface, whereby a monomolecular built-up film in which hydrophilic groups have faced the substrate side can be formed on the substrate (FIG. 2B).

Figure 3B:
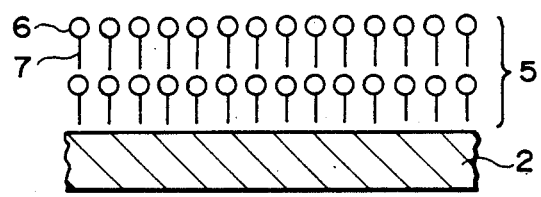
Figure 3C:
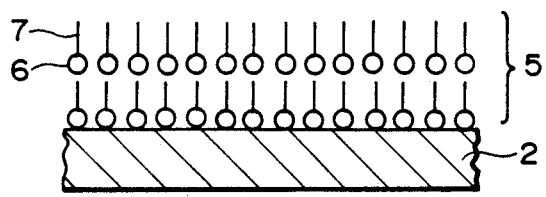

The substrate may be moved upward and downward as mentioned above, whereby monomolecular films are laminated sheet by sheet in every step and thus the built-up film can be formed. However, since the film-forming molecules will direct oppositely in the drawing-up step and the dipping step, there can be formed according to this process a Y-type film in which the hydrophilic groups and hydrophobic groups in the film-forming molecules have faced each other between the respective layers of monomolecular films (FIG. 3A). On the other hand, according to the horizontal adhesion process, a monomolecular film wherein the hydrophobic groups of film-forming molecules have faced the substrate side is formed on the substrate. According to this process, there is no alternation of the molecular orientation when monomolecular films are built-up, and can be formed an X-type film in which the hydrophobic groups have faced the substrate side in all the layers (FIG. 3B). On the contrary, a built-up film in which the hydrophilic groups have faced the substrate side in all the layers are called a Z-type film. (FIG. 3C).

In the manner as mentioned above, the monomolecular built-up film can have an orderly arranged built-up form in any of X-type, Y-type and Z-type. For example, by using the molecule wherein the hydrophilic part is conductive and the hydrophobic part is insulating as in the above-mentioned charge transfer complex, a semiconductor layer comprising conductive layers and insulating layers orderly laminated in an alternate fashion can be formed on the substrate.

Figure 4:
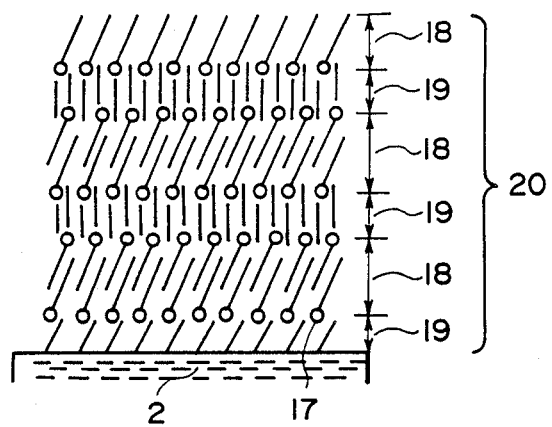
FIG. 4 is a conceptional illustration of an electrically viewed sectional structure of a semiconductor device of the present invention, having the switching effect.

When a monomolecular built-up film comprising, for example, an organic compound represented by the formula below, the monomolecular film may have a conceptional view of an electrically viewed sectional structure as shown in FIG. 4.

In FIG. 4, the numeral 17 denotes quaternary amine specifically; 18, the moiety of $R_5$ (a long chain alkyl group); and 19, the moiety of TCNQ.

The long chain alkyl groups introduced for the reason of a film formation technique are stacked in the direction crossing the film surface to form an insulating region parallel to the film surface.

On the other hand, TCNQ and TTF constituting a conductive region are stacked in such a manner that they are interposed between the hydrophobic groups (long chain alkyl groups), so that there can be formed a film having characteristic structure such that the insulating regions and conductive regions are repeated alternately in the direction perpendicular to the film surface (i.e., in the built-up direction).

Such conductive LB films act as an electrical superlattice structure against an electrical current flowing in the direction perpendicular to the film surface. As a result of various experiments, the present inventors consider that this is based on the resonance tunnel effect.

The semiconductor device thus formed can exhibit excellent temperature dependence of electrical resistance, and have specific conductance ranging approximately between $10^2$ and $10^{-2} \Omega^{-1} cm^{-1}$ in the direction parallel to its film surface. It can further act as an electrical super lattice against the electrical current flowing in the direction perpendicular to the film surface to exhibit the action of amplification. Still further, the present semiconductor device can have the non-linear switching effect showing a negative electrical resistance.

Theoretical analysis of the resonance tunnel effect is disclosed in Nakata et al, Electro. Lett. 22 (1986) 58.

The built-up film of monomolecular films comprising the charge transfer complex, formed in the manner as described above, is a monomolecular built-up film having the hydrophilic part and the hydrophobic part and showing an electrical conductivity and an insulation property in any of the built-up form of X type, Y-type or Z-type. In particular, in the Y-type built-up film, which is of the type in which the part showing an insulation property and the part showing an electrical conductivity in the monomolecular film comprising the charge transfer complex have faced each other, there can be produced a state in which conductive layers which are sufficiently conductive and insulating layers which are sufficiently insulating are laminated alternately to provide a most preferable, organic super-lattice film. Also, the insulating layers thus formed may have the thickness of an insulating layer, of about 30 to 60 angstromes when the alkyl group forming the hydrophobic part of the charge transfer complex is the long chain alkyl group, whereby there can be obtained sufficient tunnel effect for electrons.

In the present invention, the monomolecular film formed on the substrate may be of any built-up number if it is two or more layers, but, in general, preferably built up with the number of about 4 to 200 layers.

As the substrate for forming the semiconductor device of the present invention, any of conventionally known inorganic or organic substrate materials may be used. Also, since in the present invention it is unnecessary to use particularly high temperature for the formation of the semiconductor layer, there is an advantage that there can be freely used also a substrate made of a material having low thermal resistance, for example, thermoplastic or thermosetting resins such as polyethylene, polypropylene, polystyrene, polyester, polycarbonate, polyamide, polyurethane, polyvinyl chloride, polyvinylidene chloride, polysulfone, polysilicone urea resin, phenolic resin and melamine resin. The monomolecular film or monomolecular built-up film formed on the substrate as in the above may be polymerized after film formation by any suitable means when the film-forming molecules used have polymerizable portions such as double bonds or triple bonds, whereby the film strength can be remarkably increased.

The semiconductor device of the present invention can be obtained by forming an electrode or electrodes at a desired part of the semiconductor layer comprising the organic films formed in the manner as described above.

Figure 5:
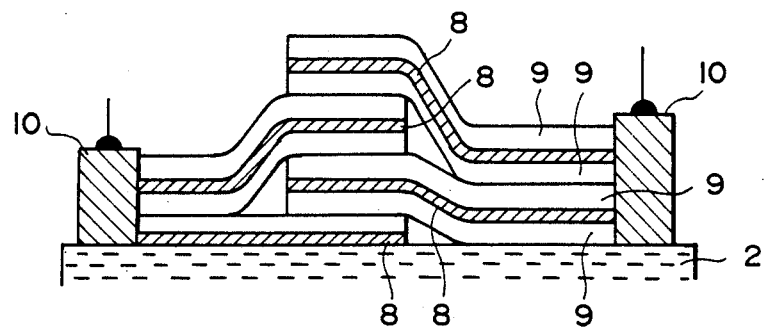
FIG. 5, FIG. 6, FIG. 7 and FIG. 9 respectively are views diagramatically showing cross-sections of several examples of the semiconductor device of the present invention.
Figure 6:
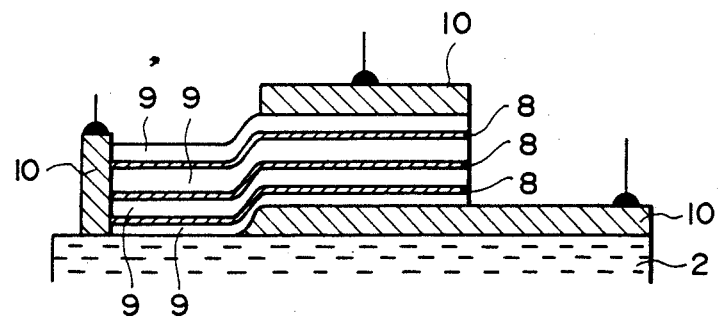

The electrodes can be formed according to any of the conventionally known methods. For example, as a MIM device, it may be constituted as shown in FIG. 5, and as shown in FIG. 6 in the case of a device utilizing a phenomenon in which electrons resonantly tunnel. More specifically, in FIG. 5 and FIG. 6, numerals 8 and 9 denote conductive layers and insulating layers, respectively, formed by the organic films; and 10 denotes externally connecting electrodes.

The basic constitution of the semiconductor device of the present invention is as described above, and any other constitution may be available so long as the device has a substrate provided thereon with the semiconductor layer comprising the charge transfer complex or the like as mentioned above and the electrodes. Any embodiments of the modification or variation thereof may be also included in the present invention.

Although not particularly described above, the molecule constituting the semiconductor layer comprised in the semiconductor device of the present invention may not necessarily be required to be of one kind, but plural kinds of molecules may constitute the semiconductor layer. The semiconductor layer is also not necessarily required to be formed by the molecules having the conductive part and the insulating part together in one molecule as in the above-mentioned charge transfer complex, and it may be formed with use of independent molecules having respectively an electrical conductivity and an insulation property. It Is further possible to form the semi-conductive layer by laminating the films of the respective X-, Y- and Z-types in an alternate fashion.

Figure 17:
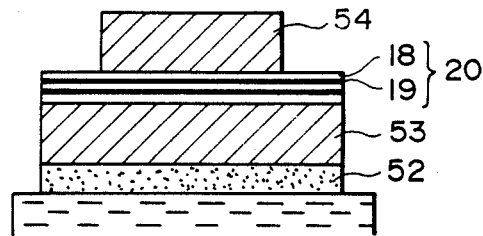
FIG. 17 is a view diagramatically showing a cross-section of the switching device of the present invention.

The switching device of the present invention, obtained by laminating conductive layers and insulating layers between electrodes to have the switching effect, may have the basic constitution as shown in FIG. 17, and any other constitution may be also available so long as the device may have a substrate provided thereon with the monomolecular built-up layer comprising the complex as mentioned above and the electrodes. Any embodiments of the modification or variation thereof may be also included in the present invention.

The semiconductor device of the present invention, comprising insulating layers and conductive layers formed by organic films and having the super lattice effect, does not particularly require the high temperature treatment required in production of the conventional semiconductor devices by use of inorganic materials, whereby a semiconductor device of very high performance can be provided economically.

Figure 7:
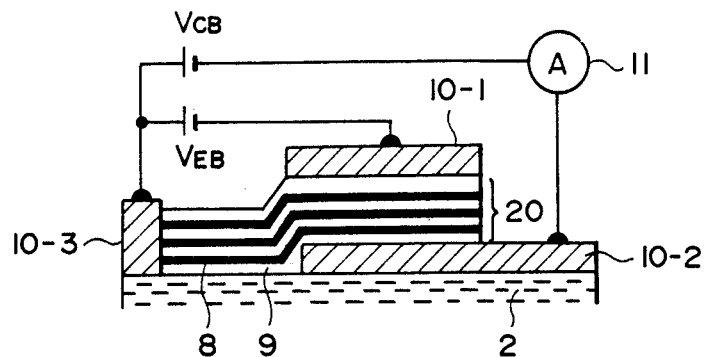

The temperature sensing medium of FIG. 7 have the constitution such that, as shown in the drawing, electrodes 10-1, 10-2 and 10-3 are provided in contact with a semiconductor layer 20 comprising conductive layers 8 and insulating layers 9 formed in an alternate fashion with use of organic films. The electrode 10-1 is an emitter electrode functioning as an emitter (E), the electrode 10-2 is a collector functioning as a collector, and the electrode 10-3 is a base electrode (B) serving as an externally connecting electrode.

Figure 8A:
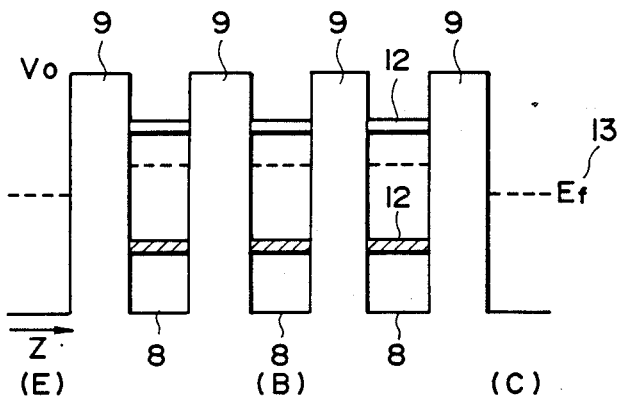
FIG. 8A and FIG. 8B are views to explain examples for energy bands possessed by the semiconductor device of the present invention.
Figure 8B:
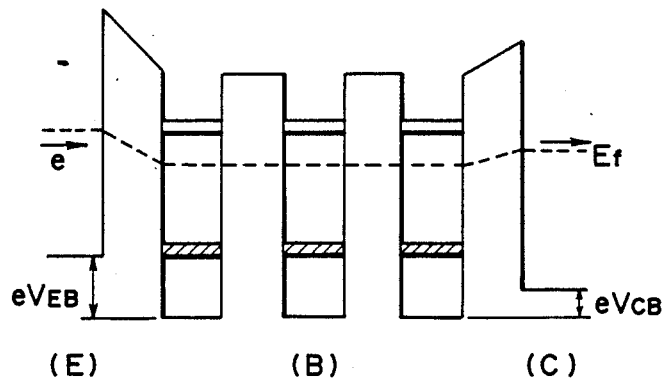

Here, the semiconductor layer 20 is formed by the monomolecular built-up film or the like comprising the above-mentioned charge transfer complex, and have an energy band, for example, as shown in FIG. 8A. In this FIG. 8A, and FIG. 8B as well, the energy band is viewed in the direction of emitter (E)—base (B)—collector (C). When bias voltages $V_{CB}$ and $V_{EB}$ are applied to the semiconductor layer 20 having such an energy band, the energy band may change as shown in 8B. At this time, electrons (e) flow into the emitter side through a resonance level 12, and the change in the tunnel current can be detected as an output by changing $V_{EB}$ as an input voltage, so that there can be brought about the action of amplification.

Figure 9:
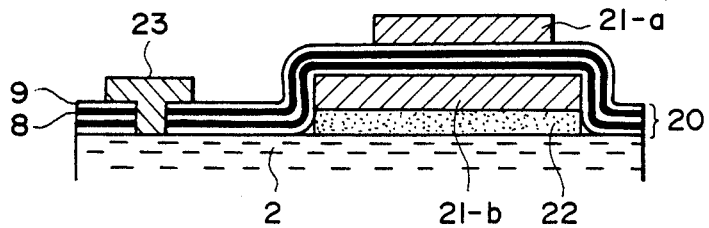

FIG. 9 shows an example of an amplification device, and this device comprises as shown in the drawing a semiconductor layer 20 formed with conductive layers 8 and insulating layers 9 comprising organic films having excellent amplification action, having the constitution such that an emitter electrode 21-a, a collector electrode 21-b and an external connecting electrode 23 are provided in contact with the semiconductor layer 20. The numeral 22 denotes an electrode support layer.

When the organic films constituting the semiconductor layer 20 have approximately a specific conductance of about $10^2$ to $10^{-2} \Omega^{-1} cm^{-1}$ and also this value has a large temperature dependency, the energy level of the resonance level 12 of the above base (B) shows a slight change along with this temperature change. Therefore, it follows that the probability that the electrons (e) tunnel (or pass) through the base (B) may change with the temperature, and the change in this tunnel current can be detected as a temperature change in the collector current to effect the temperature sensing. In order to effect the temperature sensing at a high sensitivity, the layer thickness of each of the conductive layer 8 and insulating layer 9 constitutIng the semiconductor layer 20 may preferably be made to be about 3 to 50 Å for the conductive layer, about 10 to 100 Å for the insulating layer, and, on the whole of the semiconductive layer, 50 to 1000 Å.

Hitherto, temperature sensing media utilizing the temperature change in the electrical resistance have been constituted with inorganic materials such as platinum and carbon. Since, however, such thermometers show a small temperature change in the electrical resistance of the inorganic materials, it has been required to provide an amplification circuit, which makes the product expensive. However, in the present invention, the semi-conductive layer of the temperature sensing medium is formed with the organic films having excellent temperature dependence of the electrical resistance. Accordingly, it is not particularly required to use the amplification circuit as in the conventional temperature sensing media, and there can be provided such detecting medium with a high sensitivity and with economical advantages.

As described in the above, in the present invention, the semiconductor layer comprised in the semiconductor device is constituted of organic films formed by LB process or the like and having the super lattice effect. Accordingly, it is not particularly required to carry out any high temperature treatment required in the conventional inorganic semiconductor device, and there can be economically provided a semiconductor device of very high performance. This effect is particularly remarkable in the semiconductor device formed by LB process in which the film thickness can be readily controlled in the molecular order (approximately from several Å to several ten Å). Moreover, since the semiconductor layer is formed with organic films, the device can also have excellent affinity for living bodies, and the semiconductor device of the present invention can be also useful in the field of molecular electronics or the field of bioelectronics.

It was also possible by the present invention to concretely provide a novel device by use of organic materials, that can exhibit switching effect showing non-linear current-voltage characteristics.

In the semiconductor device of the present invention, it was also found that an effective semiconductor device can be obtained even when the semiconductor layer formed by laminating the insulating layers and conductive layers is otherwise embodied as a semiconductor device having heterojunction and hetero-super lattice structure, obtained by laminating organic thin films showing in general a high insulation property (or a semi-insulation property) and inorganic thin films having an electrical conductivity (or a semi conductivity) in an alternate fashion, in other words, even when it is formed by replacing the above respective layers with an organic-inorganic composite material described below.

The semiconductor device constituted of the organic-inorganic composite material of the present invention is a semiconductor device having super lattice structure in which a potential barrier formed by an organic material is repeated two or more times against the principal energized direction. Attention was paid to the fact that there can be readily realize the periodic structure of electrical potential such that the potential barrier is repeated twice or more times, preferably 2 to 20 times, particularly 2 to 10 times. It was also expected that, similar to conventionally known super lattice semiconductor devices formed with inorganic materials only, non-linear current-voltage characteristics could be shown especially when the repeating width (meant to be the film thickness of an organic thin film or the film thickness of an inorganic thin film) is very small in such periodic structure, and this was intended to be realized. Further, even a novel semiconductor device having an amplification function, etc. was realized by utilizing such characteristics. Meanwhile, in the present invention, the above-mentioned "very small" refers to a range of from several Å to several 100 Å, and more preferably it refers to a range of from 10 Å to 100 Å.

In such a present invention, the materials applicable may range over extremely various ones in both the inorganic thin film and the organic thin film. Since almost all of presently known organic materials may have the insulation property or the semi-insulation property, they can satisfy the requirements as the materials for forming the potential barrier of the present invention. On the other hand, the inorganic materials also, having a higher electrical conductivity as compared with such organic materials, are too numerous to mention particularly. There may be included a great number of materials including metals such as Au, Ag, Al, Ni and Pt or alloys of these, semiconductors such as graphite or Si (monocrystal, polysilicon or amorphous), silicide (nickel silicide, palladium silicide, etc.), GaAs, GaP CdS and CdSe, and these can be considered to be applicable to the present invention.

In particular, in the present invention, there can be used semiconductor substances containing an element selected from Group IVB (C, Si, and Ge), semiconductor substances containing an element selected from Group IIIB (Ga and In) and an element selected from Group VB (As, P), or semiconductor substances containing an element selected from Group IIB (Cd and Zn) and an element selected from Group VIB (S, Se and O), of the long-form type periodic table.

The band gap formed at the heterojunction interface between the organic thin film and inorganic thin film used in the present invention may usually be 0.1 eV to several eV.

As a process for the formation of the device using such materials, a conventionally known thin film technique can achieve the object of the present invention. In particular, as organic materials are contained in the device in the present invention, preferred is to employ a process that can carry out the film formation under the condition of 300° C. or less. For example, here, the inorganic thin film formation process suitably usable in the present invention may include vacuum deposition and sputtering. On the other hand, in respect of the formation of the organic thin film, it is of course possible to employ deposition, electrolytic polymerization, etc., but preferred is LB process from viewpoints of controllability, readiness and reproducibility.

Suitable materials for the organic thin film in the semiconductor device constituted of a laminated body of the organic thin film and inorganic thin film may include those shown below.

(1) Molecules in which the part sharing the desired function, i.e., the functional part (e.g., a π electron system), has simultaneously a property as strongly hydrophilic nature (or strongly hydrophobic nature), for example, copper phthalocyanate, pyrene, triphenylmethane, etc., or molecules in which such functional part is polymerizable, for example, diacetylene derivatives, polyimides, etc.

(2) Those in which the functional part has not particularly any hydrophilic nature or hydrophobic nature, and the hydrophilic group, hydrophobic group, etc. as mentioned above are introduced to form the hydrophilic part and hydrophobic part in the molecule, specifically including, for example;

(a) those in which the functional part is positioned on the side of the hydrophilic part, for example, a long chain alkyl-substituted merocyanine dye having a photoelectrical conductivity, etc.;

(b) those in which the functional part is positioned at the side of the hydrophobic part, for example, those comprising pyrene combined with a long chain alkyl carboxylic acid, etc.;

(c) those in which the functional part is positioned in the middle, namely, between the hydrophobic part and hydrophilic part, for example, anthracene derivatives, diazo dye derivatives, etc.; and (d) those which are substituted by a compound having no functional group but having a hydrophilic part and a hydrophobic part such as a long chain aliphetic fatty acid like stearic acid and arachidic acid.

Needless to say, even those other than the above-mentioned may be preferable for the present invention so long as they are materials suited for LB process. For example, there can be applied the biomaterials (for example, bacteriorhodopsine or cytochrome C), synthetic polypeptides (PBLG, etc.), etc.

The substrate 2 for supporting the laminated thin films of the inorganic and organic materials as mentioned above may be any materials including metallic, glass, ceramics or plastic materials, and there can be also used biomaterials having extremely low thermal resistance.

The substrate 2 as mentioned above may have any shape, preferably a flat plate shape, but the shape may not be limited to the flat plate at all. This is because, the above film formation process has an advantage that a film can be formed in conformity with a given shape whatever shape the surface of the substrate 2 may have.

Figure 10:
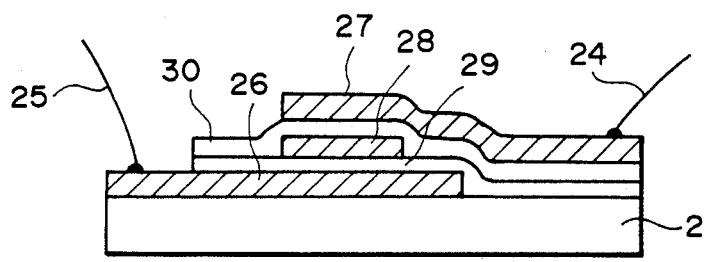
FIG. 10 is a cross-section of another semiconductor device of the present invention.

In FIG. 10, the numerals 24 and 25 denote take-out electrodes; 26, a lower electrode; 27, an upper electrode: 28, an intermediate metallic layer; 29 and 30, monomolecular built-up films; and 2, the substrate.

Figure 12:
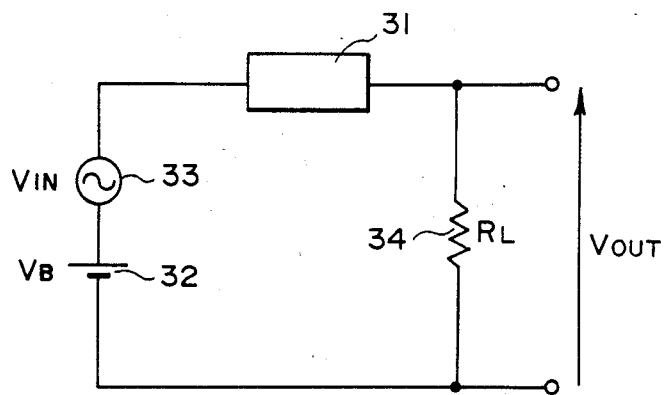
FIG. 12 is a view of an electric circuit for a measuring apparatus used when the V-I characteristics of the present invention were measured.

In FIG. 12, the numeral 31 designate a sample prepared; 32, a direct current electric source for bias; 33, an input signal source; and 34, load resistance.

The semiconductor device of the present invention, comprising a conductive portion formed with an inorganic film, and constituted by laminating a conductive organic thin film and a conductive or semi-conductive inorganic thin film, may have the effect as shown below.

(1) A good heterojunction showing a steep compositional change can be readily obtained by laminating inorganic materials and organic materials alternately.

(2) An artificial periodic structure and super-lattice structure can be constructed by repeating such a heterojunction. Here, the freedom of materials can be higher as compared with conventional super-lattice devices constituted of inorganic materials only.

(3) Since the process for forming the organic material layer by the built-up of monomolecular films is used, it can be readily achieved to control the film thickness in the molecular order (several Å to several ten Å).

Because of the excellent controlability, a high reproducibility can be achieved when the devices are formed, also with increased productivity.

(4) As a result of the above, desired non-linear current-voltage characteristics (negative resistance) can be observed in the device having the super-lattice structure.

(5) Novel two terminal and three terminal devices having the heterojunction comprising the organic material and inorganic material can be proposed, and further, in such devices, amplification characteristics and switching characteristics can be obtained.

(6) For such devices, it is unnecessary to carry out treatment under extreme conditions such as high temperature as compared with the conventional super-lattice devices constituted of inorganic materials only. Accordingly, there can be provided in future a device having high affinity for living bodies as in molecular electronics, bioelectronics, etc.

EXAMPLES

The present invention will be described below in greater detail based on Examples.

EXAMPLE 1

The semiconductor device as exemplified in FIG. 5 was prepared in the following manner.

Bis-tetracyanoquinodimethane dococylpyridinium

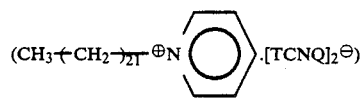

was dissolved in concentration of 1 mg/ml in a 1:1 mixed solvent comprising acetonitrile and benzene, and thereafter spread over an aqueous phase containing $CdCl_2$ at a concentration of $4 \times 10^{-4}$ mol/liter, at a water temperature of 17° C., adjusted to pH 6.8 with use of $KHCO_3$.

After evaporation to remove the acetonitrile and benzene of the solvent, surface pressure was raised up to 20 dyn/cm to form a monomolecular film. While keeping constant the surface pressure, using as a substrate a clean glass substrate (30×10 mm) whose surface had been subjected to hydrophobic treatment (the one obtained by building up cadmium arachidate to three layers according to LB process), the substrate was gently dipped by 20 mm at the rate of 15 mm/min in the direction crossing the water surface, and thereafter it was subsequently gently drawn up at the rate of 10 mm/min to build up two layers of monomolecular films. Next, the top and bottom of the substrate in the direction of dipping was reversed, and further two layers of monomolecular films were built up under the same conditions. The above operation for film formation was repeated five times to form a built-up film, thus making a semiconductor layer having the structure as shown in FIG. 6.

Externally connecting electrodes were further prepared according to a known method with use of silver paste at the position as shown in FIG. 5, to obtain a semiconductor device as shown in FIG. 5. Current-voltage characteristics were measured on this semiconductor device. As a result, switching characteristics exhibiting sufficient hysteresis were observed when several volts of electric source voltage was applied.

EXAMPLE 2 TO 15

Example 1 was repeated except that the complexes, substrates and built-up number shown below in Table 1 were used in place of the charge transfer complex and substrate used in Example 1, to obtain semiconductor devices of the present invention. All of them showed good characteristics similar to those in Example 1.

TABLE 1

Example 2:
Complex: 
Substrate: Glass substrate provided with cadmium arachidate LB film
Built-up number of monomolecular films: 10

Example 3:
Complex: 
Substrate: Glass substrate provided with cadmium arachidate LB film
Built-up number of monomolecular films: 20

Example 4:
Complex: 
Substrate: Polycarbonate plate
Built-up number of monomolecular films: 10

Example 5:
Complex: 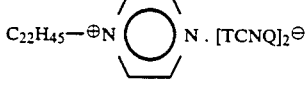
Substrate: Polycarbonate plate
Built-up number of monomolecular films: 20

Example 6:
Complex: 
Substrate: Polyvinyl chloride plate
Built-up number of monomolecular films: 10

Example 7:
Complex: 
Substrate: Polyvinyl chloride plate
Built-up number of monomolecular films: 20

Example 8:
Complex: 
Substrate: Urea resin plate
Built-up number of monomolecular films: 20

TABLE 1-continued

Example 9:
Complex: 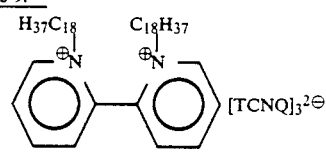
Substrate: Glass substrate provided with cadmium arachidate LB film
Built-up number of monomolecular films: 10

Example 10:
Complex: 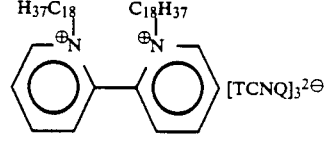
Substrate: Glass substrate provided with cadmium arachidate LB film
Built-up number of monomolecular films: 20

Example 11:
Complex: 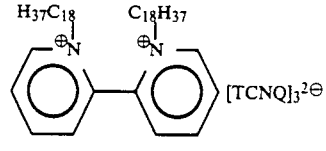
Substrate: Polycarbonate plate
Built-up number of monomolecular films: 10

Example 12:
Complex: 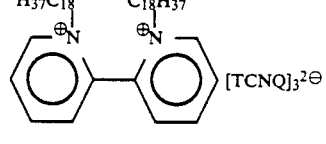
Substrate: Polycarbonate plate
Built-up number of monomolecular films: 20

Example 13:
Complex: 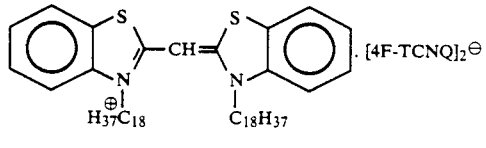
Substrate: Glass substrate provided with cadmium arachidate LB film
Built-up number of monomolecular films: 10

Example 14:
Complex: 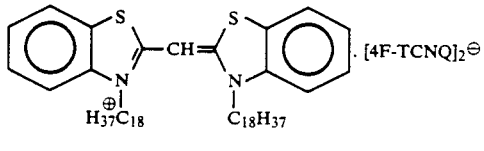
Substrate: Polycarbonate plate
Built-up number of monomolecular films: 10

Example 15:
Complex: 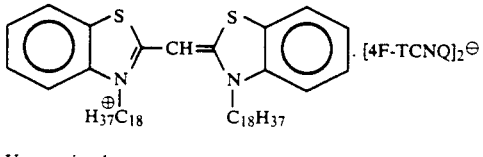
Substrate: Urea resin plate

TABLE 1-continued

Built-up number of monomolecular films: 10

The 4F-TCNQ in the above table represents the following compound:

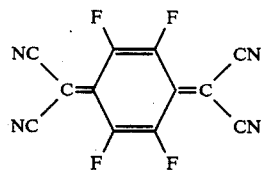

EXAMPLE 16

The semiconductor device as exemplified in FIG. 5 was prepared in the following manner.

On a glass substrate (material: 7059 available from Corning Glass Works), Cr was vacuum-deposited according to resistance heating to have a film thickness of 500 Å (deposition condition: deposition rate of 3 Å/sec at room temperature) to form an electrode support layer, followed by formation of a lower electrode 21-b as shown in FIG. 9 according to vacuum deposition of Au to have a film thickness of 1,000 Å (deposition condition: deposition rate of 2.5 A/sec at room temperature).

Bis-tetracyanoquinodimethane docosylpyridinium same as in Example 1 was then dissolved in concentration of 1 mg/ml in a 1:1 mixed solvent comprising acetonitrile and benzene, and thereafter spread over an aqueous phase containing $CdCl_2$ at a concentration of $4 \times 10^{-4}$ mol/liter, at a water temperature of 170° C., adjusted to pH 6.8 with use of $KHCO_3$.

After evaporation to remove the acetonitrile and benzene of the solvent, surface pressure was raised up to 25 dyn/cm to form a monomolecular film on the aqueous phase. While keeping constant the surface pressure, an electrode substrate having the above lower electrode formed thereon was dipped at the rate of 10 mm/min in the direction crossing the water surface, and thereafter it was subsequently gently drawn up at the rate of 5 mm/min to build up two layers of monomolecular films. The above operation for film formation was repeated further four times to prepare a built-up film, thus preparing a semiconductor layer having the structure as shown in FIG. 9.

Next, as shown in FIG. 9, an upper electrode 21-a (diameter: 2 mm) was formed by vacuum deposition of Au according to resistance heating to have a film thickness of 1,000 Å. At this time, the deposition rate was set to 2.5 Å/sec, and the substrate temperature, 20° C.

On the sample prepared as above, a measure was taken to peel a part of the laminated film comprising the monomolecular built-up film, at the region as shown in FIG. 9 extending over the size of $2 \times 2$ mm$^2$, and to insert a metal for a take-out electrode 23 into the same region. More specifically, a mask (t=0.1) made of Mo, having a desired shape was brought into close contact with the sample, which was placed in a vacuum container of a high frequency ion plating apparatus having a gas inlet and an electron beam evaporation source in combination. Ar gas (gas pressure: $5 \times 10^{-3}$ Torr) was introduced thereinto, high frequency electric power (13.56 MHz, 12 W) was applied thereto, the resulting Ar$^+$ ion beam was accelerated at 100 eV and irradiated for 10 minutes from upper side of the sample to etch the region not covered with the mask. The substrate temperature was set to room temperature. Further, without taking out the sample from the vacuum container, the inside of the container was again kept in a vacuum state ($2 \times 10^{-6}$ Torr), and, using this time an electron beam deposition source, Al was deposited under the conditions of emission current of 600 mA and accelerating voltage of 10 kV (film thickness: 500 A).

The electrodes were formed as described above to obtain the semiconductor device as exemplified in FIG. 9.

On the semiconductor device produced according to the above procedures, using the lower Au electrode as a collector, the upper Au collector as an emitter and the side part Al electrode as a base, current-voltage characteristics between the collector and emitter were measured to reveal that sufficient amplification characteristics were obtained.

EXAMPLE 17

On a glass substrate similar to that of Example 16, an electrode support layer and a lower Au electrode were formed as shown in FIG. 9 in the same manner as in Example 16, and thereafter this electrode substrate was dipped in an aqueous phase adjusted in the same manner as in Example 16.

Subsequently, $CH_3(-CH_2)_{11}C\equiv C-C\equiv C(-CH_2)_8COOH$ (hereinafter "DA12-8") dissolved in benzene in concentration of 1 mg/ml was spread over this aqueous phase. After benzene of the solvent was removed by evaporation, surface pressure was raised up to 30 dyn/cm to form a monomolecular film on the aqueous phase. While keeping constant the surface pressure, the above electrode substrate having been dipped in the aqueous phase was drawn up at the rate of 3 mm/min in the direction crossing the water surface, followed by carrying out further dipping (rate: 10 mm/min) and drawing-up (rate: 3 mm/min) to form a three layer built-up film comprising DA12-8 on the electrode substrate.

Next, after DA12-8 on the aqueous phase was well removed, octadecyl-tetracyanoquinodimethane tetramethylthiafulvalene (ODTCNQ-TMTTF) dissolved in concentration of 1 mg/ml in a 1:1 mixed solvent comprising acetonitrile and benzene, was a fresh spread over this aqueous phase. After acetonitrile and benzene of the solvent was removed by evaporation, surface pressure was raised up to 25 dyn/cm to form a monomolecular film on the aqueous phase. While keeping constant the surface pressure, the above electrode substrate built up with DA12-8 was dipped at the rate of 10 mm/min, and thereafter drawn up at the same rate to further build up two layers of ODTCNQ-TMTTF monomolecular films on the DA12-8 built-up film.

Next, after ODTCNQ-TMTTF on the aqueous phase was removed, DA12-8 was again spread over it to build up, under the same conditions as above, two layers of DA12-8 monomolecular films on the ODTCNQ-TMTTF built-up film.

Subsequently, the above operations were repeated to build up two layers of ODTCNQ-TMTTF on the above DA12-8 built-up film, and further thereon four layers of DA12-8 were build up to obtain the semiconductor device having the structure as shown in FIG. 9.

On the semiconductor layer produced according to the procedures as above, an upper Au electrode and a side part Al electrode were formed in entirely the same manner as in Example 16, and current-voltage characteristics were measured in the same manner as in Example 16 to reveal that sufficient amplification characteristics were obtained.

EXAMPLES 18 to 22

Example 16 was repeated except that the complexes and built-up number shown below in Table 2 were used in place of the charge transfer complex used in Example 16. to obtain semiconductor devices of the present invention. All of them showed good characteristics similar to those in Example 16.

TABLE 2

Example 18:
Complex:

Built-up number of monomolecular films: 20
Example 19:
Complex:

Built-up number of monomolecular films: 16
Example 20:
Complex:

Built-up number of monomolecular films: 8
Example 21:
Complex:

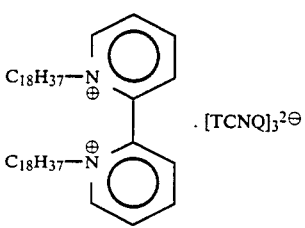

Built-up number of monomolecular films: 10
Example 22:
Complex:

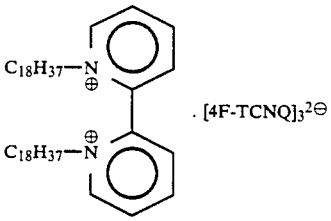

Built-up number of monomolecular films: 10

EXAMPLE 23

The semiconductor device as exemplified in FIG. 7 was prepared in the following manner.

On a clean glass substrate 2, an Al electrode as a collector electrode 10-2 was formed using a known vapor deposition process to have a film thickness of 1,500 Å, and thereafter, to apply hydrophobic treatment on the surface of said substrate, a layer of a monomolecular film of cadmium arachidate was laminated on the substrate according to the above-mentioned LB process.

Subsequently, bis-tetracyanoquinodimethane docosylpyridinium similar to that in Example 1 was dissolved in a 1:1 mixed solution comprising acetonitrile and benzene, and thereafter the solution was spread over an aqueous phase containing $CdCl_2$ at a concentration of $4 \times 10^{-4}$ mol/liter, water temperature of 17° C., adjusted to pH 6.8 with use of $KHCO_3$.

Next, after evaporation to remove the acetonitrile and benzene of the solvent, surface pressure was raised up to 20 dyn/cm to form a monomolecular film on the aqueous phase. While keeping constant the surface pressure, the above glass substrate was gently dipped at the rate of 15 mm/min in the direction crossing the water surface, and thereafter it was subsequently drawn up at the rate of 10 mm/min to build up two layers of monomolecular films comprising the above bis-tetracyanoquinodimethane docosylpyridinium. This operation was repeated three times to form on the substrate a monomolecular built-up film comprising six layers in total of monomolecular films of bis-tetracyanoquinodimethane docosylpyridinium, thus obtaining a semiconductor layer 20 formed by conductive layers 8 and insulating layers 9 provided alternately as shown in FIG. 7.

Next, on this semiconductor layer, an Al electrode as an emitter electrode 10-1 was formed using the vapor deposition process same as above to have a film thickness of 1,500 Å. Thereafter, using a conductive paste, a base electrode 10-3 was formed to obtain the semiconductor device as exemplified in FIG. 7.

To each of the emitter electrode 10-1 and collector electrode 10-2 of the semiconductor device thus obtained, a bias voltage of 0.5 V with reference to the base electrode 10-3 was applied to measure the collector current at temperature of 300° K. and 100° K., respectively. As a result, the current value at 300° K. was found to be 10 times that at 100° K. or higher, revealing that this semiconductor device showed very highly sensitive temperature detecting characteristics.

EXAMPLE 24

Example 23 was repeated except that bis-tetracyanoquinodimethane docosylphenadinium was used in place of bis-tetracyanoquinodimethane docosylpyridinium, to produce the semiconductor device as exemplified in FIG. 7, and the change in the collector current of said device was measured in the same manner as in Example 23. As a result, a change of 10 times or more was observed in the current value at 300° K. and compared with the current value at 100° K.

EXAMPLE 25

According to the procedures shown below, a sample having the structure of a metal (a lower electrode) 26/a monomolecular built-up film 29/a metal 28/a monomolecular built-up film 30/a metal (an upper electrode) 27 was produced (FIG. 10). At this time, the layer number of the both side monomolecular built up films 29 and 30 sandwiching the intermediate, metallic layer 28 was made equal (In the drawing, numerals 24 and 26 each denote a take-out electrode). Firstly, according to LB process, on a glass substrate 2 (7509, available from Corning Glass Works) having been subjected to hydrophobic treatment (built up with three layers of cadmium arachidate $[(CH_3(CH_2)_{18}COO^-)_2Cd^{2+}]$), Cr was vacuum-deposited as a subbing layer to have a thickness of 500 Å (resistance heating; substrate temperature: room temperature), and Au was further deposited according to the same method and provided as a lower electrode 26. On such a substrate 2 serving as a carrier, monomolecular films of cadmium arachidate were built-up according to LB process to prepare a built-up film 29.

The manner for the building-up will be described below. A chloroform solution in which arachidic acid (CH$_3$(CH$_2$)$_{18}$COOH) was dissolved at a concentration of 1 mg/ml was spread over an aqueous phase containing CdCl$_2$ at a concentration of $4 \times 10^{-4}$ mol/liter at a water temperature of 20° C., adjusted to pH 6.4 with use of KHCO$_3$, to form a monomolecular film 4 (as shown in FIGS. 2A and 2B) on the water surface. After evaporation to remove the solvent, surface pressure of such a monomolecular film 4 was raised up to 30 mN/m, and while keeping constant the surface pressure, the above substrate 2 was gently dipped at a constant rate of 10 mm/min in the direction crossing the water surface, and thereafter it was subsequently gently drawn up at the same rate to build u two layers of Y-type monomolecular films. Such operation was repeated appropriate times to form on the above substrate a built-up film 29 comprising each two, four, six, eight or ten layers. Next, Au (diameter: 1 mm film thickness: 80 Å) with a dot pattern was deposited on the surface of the thus formed film to form the metallic intermediate layer 28. Subsequently, monomolecular films of cadmium arachidate were built up according to entirely the same procedures as in the above with the number of two, four, six, eight or ten layers each (built-up film 30), and Au (diameter: 2 mm; film thickness: 1,000 Å) was further deposited thereon as the upper electrode 27.

Figure 11:
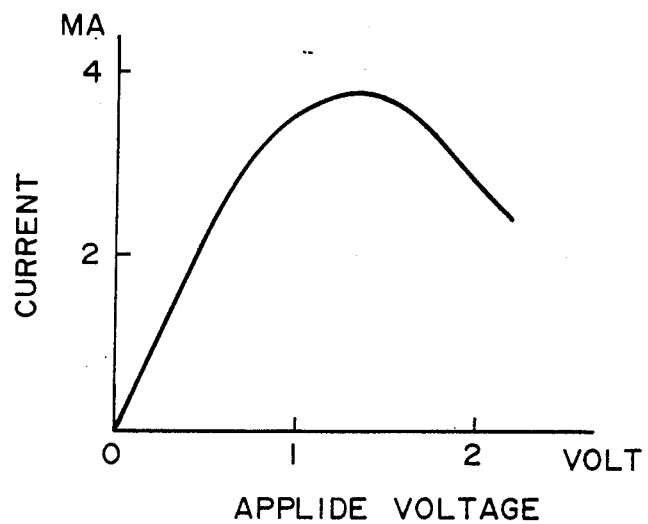
FIG. 11 is a characteristic view showing the V-I characteristics of the same.

Samples produced as above were placed in a cryostat (a vacuum container) to measure current characteristics (V-I characteristics) when a voltage was applied between the upper electrode and lower electrode under the condition of a low temperature (77° K.) As a result, the sample comprising the two-layer or four layer monomolecular built-up film had a maximum in the vicinity of 1 to 2 V in its V-I characteristics, and, moreover, there was observed a convex characteristic curve, whereby it was confirmed that such samples show the negative resistance. FIG. 11 clearly shows the V-I characteristics when a sample of the four-layer monomolecular built-up film was used.

EXAMPLES 26 to 32

Samples having structure similar to Example 25 were produced. Here, the molecule for constituting the monomolecular built-up film (potential barrier layer) was 1, 2 or 3 shown below. The conditions and the process for the formation of monomolecular films and building-up thereof were made entirely same as those in Example 25 except that the surface pressure was set to 20 mN/m, water temperature was kept to 17° C., and building-up rate was controlled to 5 mm/min. However, the layers 29 and 30 interposed between metallic layers were each made to comprise a two layer built-up film. 1: Diacetylene derivative C$_{12}$H$_{25}$—C≡C—C≡C—CH$_2$)$_8$COOH
2: Azulene type squarilium dye

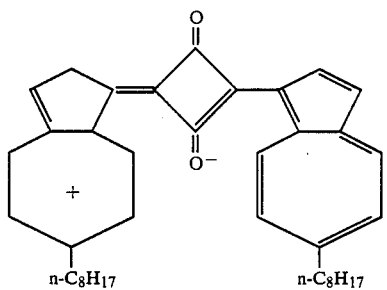

3: Anthracene derivative

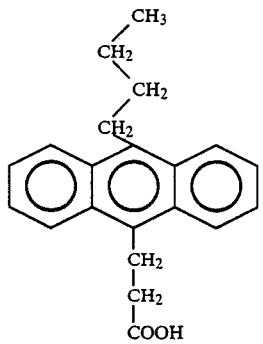

The lower electrode 26 and upper electrode 27 were also formed in entirely the same manner as in Example 25.

For each of the samples, Al, Au, Ni or Pt was used in the metallic intermediate layer sandwiched by the monomolecular built up films, provided, however, that the film thickness was made uniform to 50 Å in all samples, and the film formation was carried out by using the method shown in the following table. Since any formation methods shown therein are conventionally known, and also well established techniques, detailed descriptions relating to their procedures are omitted here. However, the conditions that should be noted in the present invention are shown below.

(a) Al (sputtering); Example 31

Specifically, magnetron sputtering was used to decrease damage on the film. Using Ar positive ions, gas pressure was set to $2 \times 10^{-3}$ Torr, target voltage was set to 250 V, and target current was controlled so as to give film formation rate of 2 Å/sec.

(b) Pt (electron beam method); Example 32

At the time of heating the target (Pt 20 mm in diameter and 10 mm in thickness), since a splash (scattering in the form of particles) may very readily occur as compared with other metals, it was necessary to make small the electron beam output to lower the Film formation rate up to 0.05 Å/sec.

In respect of the samples prepared in the above manner, V-I characteristics were measured in the same manner as in Example 25 to obtain the result as shown in the following table.

| Example | Monomolecular built-up film constituent molecule | Metal and formation method | Occurrence of negative resistance |
|---|---|---|---|
| 26 | 1 | Al | resistance heating (deposition) | + |

-continued

| Example | Monomolecular built-up film constituent molecule | Metal and formation method | | Occurrence of negative resistance |
|---|---|---|---|---|
| 27 | 2 | Al | resistance heating (deposition) | ++ |
| 28 | " | Au | resistance heating (deposition) | ± |
| 29 | 3 | Ni | resistance heating (deposition) | + |
| 30 | " | Al | resistance heating (deposition) | + |
| 31 | " | Al | Sputtering | + |
| 32 | " | Pt | Electron beam heating (deposition) | + |

(Table 3, Formation conditions and measurement results)

In the table, as shown by symbol +, the negative resistance was observed in almost all of the samples. Also, the voltage showing negative resistance is several volts in every sample, and this is presumably because the structural parameter such as film thickness of the respective layers is substantially equal in different samples. However, in the result of Example 27, the peak (maximum) of the current is relatively sharp, and therefore the negative resistance was shown as a result even under the condition of room temperature (shown by symbol ++ in the table). In Example 28, despite of the employment of gold, the negative resistance was seen In only one sample among 12 samples produced under the same conditions, and no remarkable negative resistance was observed (as shown by symbol ± in the table). This is presumably because the film thickness of the metallic layer was made far thinner as compared with that of Example 25, whereby it was difficult to obtain a uniform thin film of about 5 Å when Au was employed.

EXAMPLE 33

Selecting one of the samples produced in Example 27, an electrical circuit as shown in FIG. 12 was constructed. In FIG. 12, the numeral 31 denotes the sample forming a two-terminal element; 32, a voltage source VB for direct-current bias; and 33, an input signal source $V_{in}$, and specifically a low frequency oscillator was used. The numeral 34 denotes load resistance where a metal coat type 300 resistor was used. Observation was made of the potential generated in load resistance with use of an oscilloscope which was connected to its both ends (input resistance: 1 M).

First, the output of the input signal source $V_{in}$ 33 was kept to zero, and the voltage source $V_B$ for direct-current bias was set so that the sample 31 can have a voltage showing the negative resistance, specifically, 2.2 V. Then, a sinusoidal wave having a peak value of 50 mV and frequency of 1 kHz was applied to the input signal source $V_{in}$ 33. As a result, there was obtained a sinusoidal wave of 1 kHz having a peak value of 85 mV same as in the both ends of the resistor 34. Namely, it was shown that the sample 31 functioned as an amplification device.

Meanwhile, there was almost no change in the amplification factor so long as the frequency was changed up to 1 MHz.

EXAMPLE 34

Figure 13A:
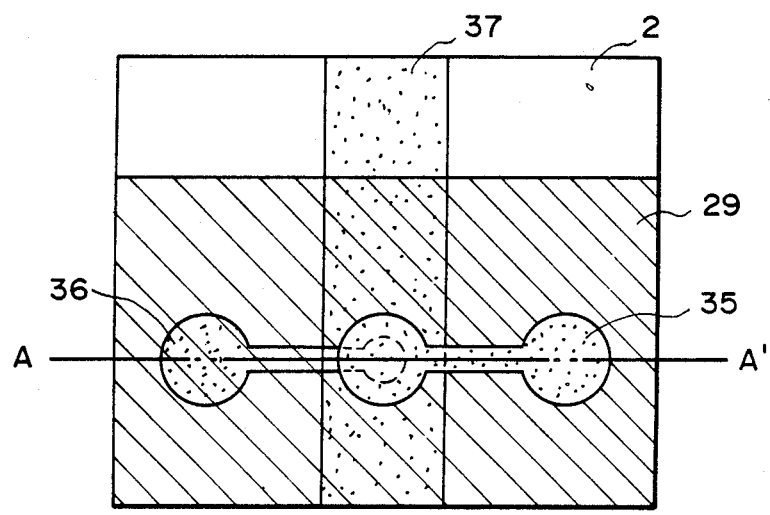
FIG. 13A is a plan view of still another semiconductor device of the present invention.
Figure 13B:
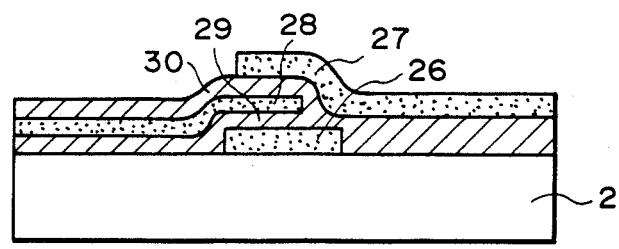
FIG. 13B is a cross-section thereof along the line of A to A' in FIG. 13A.

Produced was a sample having the constitution entirely same as in Example 27. Here, however, an externally take out electrode was provided on the metallic intermediate layer 28 sandwiched by monomolecular built-up films. Specifically, there was taken the device constitution as shown in FIG. 13. This was able to form by entirely the same procedures as in Example 27 except that the mask pattern used in the metal deposition was replaced.

Figure 14:
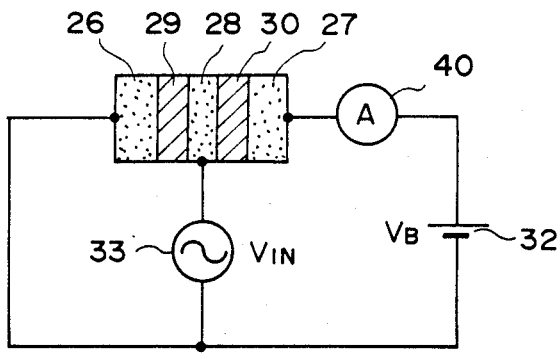
FIG. 14 is a view of an electric circuit for a measuring equipment used when the V-I characteristics of the same semiconductor device of the present invention were measured.

Next, in such a sample, probes were placed in the regions 35, 36 and 37 to make contact with the upper electrode 27, the intermediate electrode 28 and the lower electrode 26, respectively. At this time, particularly in the region 36, the probe was strongly (with needle pressure of ≳50 mg) pressed against the monomolecular built-up film so as to break through it to make the contact. An ammeter 40, a direct current electrical source 32 for the bias voltage $V_B$, and a direct-current 33 source for the singal source $V_{in}$ were further connected to such probes to make up the electrical circuit as shown in FIG. 14. Subsequently, while keeping an output for the direct-current 33 for the signal source $V_{in}$ to $\theta V$, an output for the direct-current electrical source 32 for the bias voltage $V_B$ was set so as to achieve a best flow of the current. At this time, $V_B$ was about 1.4 V.

Figure 15:
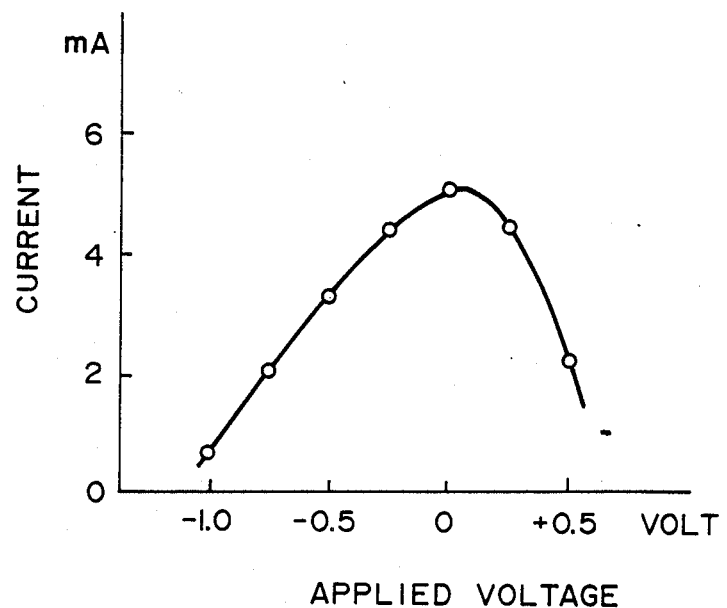
FIG. 15 is a characteristic view showing the V-I characteristics thus measured.

Under the conditions set as above, the current flowing in the circuit when $V_{in}$ was changed stepwise by 250 mV was measured to obtain the result as shown in FIG. 15. This result shows that such a three-terminal device functions as a voltage control type current amplification device. Of course, since the current quantity is greatly changed depending on the voltage applied, it is also shown that the device can be applied as a switching device.

EXAMPLE 35

Figure 16A:
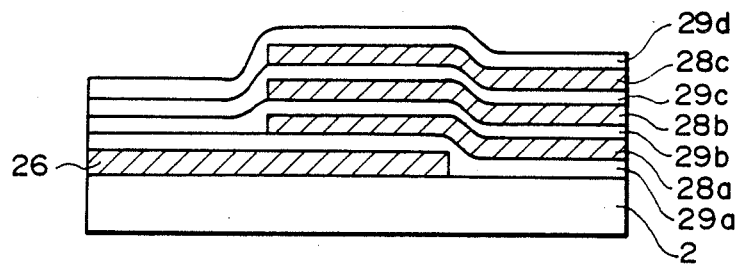
FIG. 16A, FIG. 16B and FIG. 16C are sectional views illustrating the process for producing another semiconductor device of the present invention.
Figure 16B:
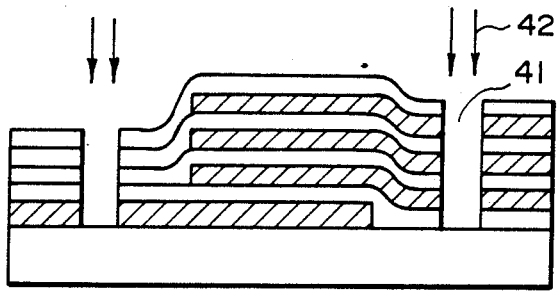
Figure 16C:
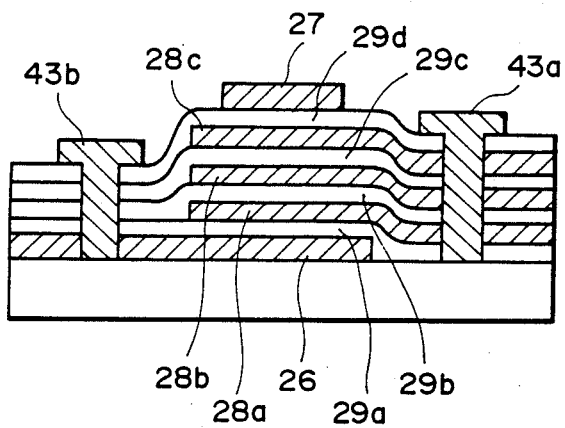

In the region interposed between the upper electrode and lower electrode in Example 34, produced was a three-terminal device having the structure wherein the potential barrier layer (a monomolecular built-up film was used in Example 34) is repeated twice or more, specifically, four times in the present Example. Its schematical cross sectional structure is shown in FIG. 16C. A metallic lower layer 26, a metallic upper layer and monomolecular built-up films 29a, 29b, 29c and 29d, and metallic intermediate layers 28a, 28b and 28c were all formed under the conditions same as those in Example 34, provided, however, that the uppermost monomolecular built up film was formed after the film formation for the monomolecular built-up film/metallic film was repeated three times. Also, in order to make sure the contact with metallic intermediate layers, a measure was taken to peel a part of the laminated films comprising the monomolecular built-up films was peeled (peeled portions 41) and insert metals 43a and 43b for take-out electrodes in the corresponding regions. The state and procedures thereof are shown in FIGS. 16A, 16B and 16C. More specifically, a mask (0.1 mm in thickness) made of Mo, having a desired shape was brought into close contact with the sample, which was placed in a vacuum container of a high frequency ion plating apparatus having a gas inlet and an electron beam evaporation source in combination. Ar gas (was pressure: $5 \times 10^{-3}$ Torr) Was introduced thereinto, high frequency electric power (13.56 MHz, 12 W) was applied thereto, the resulting Ar+ ion beam 42 was accelerated at 100 eV and irradiated for 20 minutes from upper side of the sample to etch the region not covered with the mask. The substrate temperature was set to room temperature. Further, without taking out the sample from the vacuum container, the inside of the container was again kept in a vacuum state ($2\times 10^{-6}$ Torr), and, using this time an electron beam deposition source, Al was deposited under the conditions of emission current of 600 mA and accelerating voltage of 10 kV (film thickness: 500 Å). Thereafter, the formation of the above electrodes were carried out.

In respect of the device obtained in the above manner, the current-voltage characteristics were observed in entirely the same manner as in Example 34 to have confirmed that the device has an amplification ability.

In Example described in the above, LB process was used for the formation of the potential barrier layer, but, without limitation to LB process, any film formation process can be used so long as it can form a very thin, uniform insulating or semi-conductive organic thin film. Specifically, there can be included vacuum deposition, electrolytic polymerization, CVD process, etc., whereby the scope of usable organic materials can be expanded.

As having already mentioned herein, in respect also of the conductive layer surrounded by the potential barrier, any film formation process can be used so long as it can form a uniform thin film on the organic thin film layer, without limitation to the vacuum deposition or sputtering.

Moreover, the present invention has no limitation at all in the materials for the substrate or the shape thereof.

EXAMPLE 36

On a glass substrate (material: 7059 available from Corning Glass Works), Cr was vacuum-vapor-deposited according to resistance heating (a film thickness of layer 52 in FIG. 17: 500 Å; deposition rate: 3 Å/sec; room temperature), followed by further vacuum deposition of Au (a film thickness of layer 53 in FIG. 17: 1,000 Å; deposition rate: 2.5 Å/sec; room temperature) to form an electrode support layer. Subsequently, bis tetracyanoquinodimethane docosylpyridinium

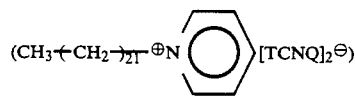

was dissolved to a concentration of 1 mg/ml in a 1:1 mixed solvent comprising acetonitrile and benzene, and thereafter spread over an aqueous phase containing $CdCl_2$ at a concentration of $4\times 10^{-4}$ mol/liter, water temperature of 17° C., adjusted to pH 6.8 with use of $KHCO_3$. After evaporation to remove the acetonitrile and benzene of the solvent, surface pressure was raised up to 25 dyn/cm to form a monomolecular film on the aqueous phase. While keeping constant the surface pressure, an electrode substrate having the above lower electrode formed thereon was gently dipped at the rate of 10 mm/min in the direction crossing the water surface, and thereafter it was subsequently gently drawn up at the rate of 5 mm/min to build up two layers of Y-type monomolecular films. The above building-up operation was repeated further three times to prepare a monomolecular built-up film.

Next, an upper electrode (54 in FIG. 17; diameter: 2 mm film thickness: 1,000 Å)) was formed by vacuum deposition of Au according to resistance heating. At this time, the deposition rate was set to 2.5 Å/sec, and the substrate temperature, 20° C.

Figure 18:
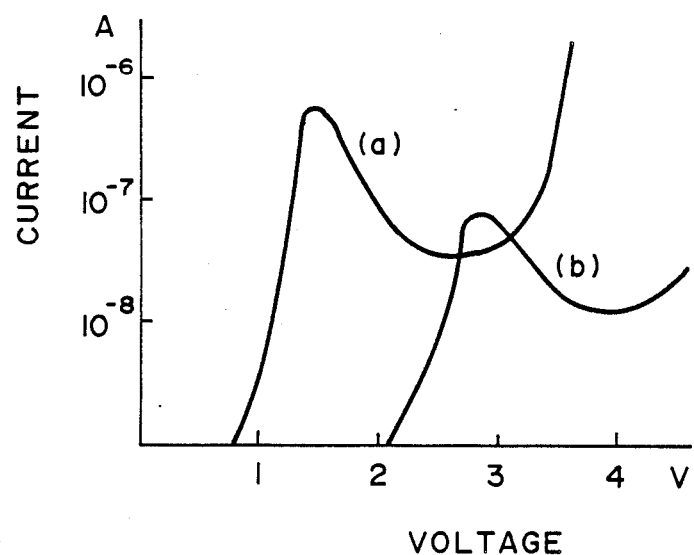
FIG. 18 is a voltage-current curve shown by the device having a switching function, of the present invention.

In respect of the device (FIG. 17) produced according to the above procedures, the current-voltage characteristics between the electrodes were measured. As a result, the current-voltage characteristics as shown by the curve (a) in FIG. 18A, and a clear negative resistance was observed at about 1.50 V at room temperature.

EXAMPLE 37

After a Cr film was formed in the same manner as in Example 36, an Au film was provided to prepare a lower electrode substate. Subsequently, $CH_3$-$(CH_2)_{\overline{11}}$-$C\equiv C$-$C\equiv C$-$(-CH_2)_{\overline{8}}$-COOH (hereinafter "DA12-8") dissolved in benzene to a concentration of 1 mg/ml was spread over an aqueous phase having $CdCl_2$ concentration of $4\times 10^{-4}$ mol/liter, at a water temperature of 17° C., adjusted to pH 6.8 with use of $KHCO_3$. After the solvent was removed, surface pressure was raised up to 30 dyn/cm to form a monomolecular film. While keeping constant the surface pressure, the electrode substrate having been beforehand dipped in the aqueous phase was drawn up at the rate of 3 mm/sec in the direction crossing the water surface, followed by carrying out further dipping (rate: 10 mm/sec) and drawing-up (rate: 3 mm/sec) to form a three layer built-up film comprising DA12-8 on the electrode. Next, after DA12-8 on the aqueous phase was well removed, octadecyltetracyanoquinodimethane tetramethylthiafulvalene (ODTCNQ-TMTTF) was dissolved to a concentration of 1 mg/ml in a 1:1 mixed solvent comprising acetonitrile and benzene, and spread over this aqueous phase. After the solvent was removed by evaporation, surface pressure Was raised up to 25 dyn/cm to form a monomolecular film. While keeping constant the surface pressure, the electrode substrate built up with DA12-8 was dipped and drawn up at the rate of 10 mm/sec to further build up two layers of ODTCNQ-TMTTF monomolecular films. Next, after ODTCNQ-TMTTF monomolecular film on the aqueous phase was removed, DA12-8 was again spread over it to build up, under the same conditions as above, two layers of DA12-8 monomolecular films on the electrode substrate. Subsequently, the above operations were repeated to build up two layers of ODTCNO-TMTTF on the above electrode substrate, and further thereon four layers of DA12-8 were build up. Finally, from an upper side of the film surface, an upper electrode made of Au was formed in the same manner as in Example 36, and the current-voltage characteristics were measured to obtain non-linear characteristics as shown by the curve (b) in FIG. 18.

EXAMPLE 38

Example 36 was repeated except that the materials and built-up number shown below were used, to obtain device. As a result, they showed the non-linear current-voltage characteristics similar to those in FIG. 18. This is considered to have resulted from the resonance tunnel effect based on the super lattice structure wherein the insulating regions and conductive regions are repeated in the direction perpendicular to the film surface.

| Compound | Built-up number |
|---|---|
| $C_{22}H_{45}-^{\oplus}N\bigcirc$ [TCNQ]$_2^{\ominus}$ | 20 |
| $C_{22}H_{45}-^{\oplus}N\bigcirc N$ [TCNQ]$_2^{\ominus}$ | 12 |
| $C_{22}H_{45}-^{\oplus}N\bigcirc N$ [TCNQ]$_2^{\ominus}$ | 6 |
| $C_{22}H_{45}-^{\oplus}N$ (naphthyl) [TCNQ]$_2^{\ominus}$ | 8 |
| $C_{18}H_{37}^{\oplus}N$ / $C_{18}H_{37}^{\oplus}N$ [TCNQ]$_3^{2\ominus}$ | 8 |
| $C_{18}H_{37}^{\oplus}N$ / $C_{18}H_{37}^{\oplus}N$ [F$_4$-TCQN]$_3^{2\ominus}$ | 8 |
| where F$_4$-TCNQ: (structure) | |
| $C_{22}H_{34}^{\oplus}N\bigcirc N$ {NC/NC=...=CN/CN}$^{\ominus}$ | 8 |

What is claimed is:

1. A non-linear type device capable of resonance tunnel phenomenon comprising a semiconductor and electrodes, said semiconductor including alternating laminated insulating and conductive layers, each layer being made of an organic material, said insulating layer being a monomolecular film or monomolecular built-up film of an organic compound wherein said organic compound is a charge transfer complex having an insulating, hydrophobic part and a conductive, hydrophilic part in combination.

2. The non-linear type device capable of resonance tunnel phenomenon of claim 1, wherein said insulating layer comprises an organic material and said conductive layer comprises an organic material which includes a monomolecular film or monomolecular built-up film of an organic compound having a hydrophilic part and a hydrophobic part in the molecule thereof.

3. A non-linear type device capable of resonance tunnel phenomenon comprising a semiconductor and electrodes, said semiconductor including alternating laminated insulating and conductive layers, each layer being made of an organic material, said insulating layer being a molecular film or monomolecular built-up film of an organic compound wherein said organic compound is a charge transfer complex having an insulating, hydrophobic part and a conductive, hydrophilic part in combination, wherein said charge transfer complex is a complex of a long chain alkyl group containing quaternary ammonium compound with tetracyanoquinodimethane.

4. A semiconductor device, comprising (1) a semiconductor positioned between an emitter electrode and a collector electrode and including alternate laminated layers of an insulating layer made of an organic material and a conductive layer made of an organic material, said insulating layer being a monomolecular film or monomolecular built-up film, and (2) a base electrode electrically connected to said conductive layer; said semiconductor, wherein the device increases a current between said emitter electrode and said collector electrode depending on the current between the emitter electrode and the base electrode.

5. A non-linear type device capable of resonance tunnel phenomenon comprising a semiconductor and electrodes, said semiconductor including alternate laminated layers of an insulating layer being a monomolecular film or monomolecular built-up film of an organic compound wherein said organic compound is a charge transfer complex having an insulating, hydrophobic part and a conductive, hydrophilic part in combination, and a conductive layer made of an organic material, said semiconductor exhibiting negative electrical resistance.

6. A non-linear type device capable of resonance tunnel phenomenon comprising a semiconductor and electrodes, said semiconductor including alternate laminated layers of an insulating layer being a monomolecular film or monomolecular built-up film of an organic compound wherein said organic compound is a charge transfer complex having an insulating, hydrophobic part and a conductive, hydrophilic part in combination, wherein said charge transfer complex is a complex of quaternary ammonia compound having a long chain alkyl group with tetracyanoquinodimethane and a conductive layer made of an organic material, said semiconductor exhibiting negative electrical resistance.

7. The non-linear type device capable of resonance tunnel phenomenon of claim 2, wherein said monomolecular built-up film is in the range of 4 to 200 layers.

8. A semiconductor device comprising a semiconductor and electrodes, said semiconductor including alternate laminated layers of an insulating layer being a monomolecular film or monomolecular built-up film made of an organic material and a conductive layer made of an inorganic material.

9. The semiconductor device of claim 8, wherein said organic insulating layer is a thin film of an organic compound the molecule of said organic compound having a hydrophilic part and a hydrophobic part.

10. The semiconductor device of claim 8, wherein the number of interfaces between said conductive layers and said insulating layers is in the range of from 2 to 20.

11. The semiconductor device of claim 8, wherein the number of interfaces between said conductive layers said insulating layers is in the range of from 2 to 10.

12. The semiconductor device of claim 8, wherein said organic insulating layer has a thickness ranging from several Å to several hundred Å.

13. The semiconductor device of claim 8, wherein said organic insulating layer has a thickness in the range of from 20 Å to 100 Å.

14. The semiconductor device of claim 8, wherein said inorganic conductive layer has a thickness in the range of from several Å to several hundred Å.

15. The semiconductor device of claim 8, wherein said inorganic conductive layer has a thickness in the range of from 10 Å to 100 Å.

16. The semiconductor device of claim 8, wherein said inorganic conductive layer is a thin film formed from a metal or an alloy.

17. The semiconductor device of claim 16, wherein said metal or alloy comprises Al, Ag, Au, Ni or Pt.

18. The semiconductor device of claim 8, wherein said inorganic conductive layer is a thin film formed from a substance containing Si or Ge, a substance containing an element selected from Group IIIB and an element selected from Group VB, or a substance containing an element selected from Group IIB and an element selected from Group VIB of the long-form periodic table.

19. The semiconductor device of claim 18, wherein said element selected from Group IIIB is Ga or In and said element selected from Group VB is As or P.

20. The semiconductor device of claim 18, wherein said element selected from Group IIB is Cd or Zn and said element selected from Group VIB is S, Se or O.

21. The semiconductor device of claim 8, wherein said inorganic conductive layer is a thin film formed from a silicide.

22. The semiconductor device of claim 21, wherein said silicide is nickel silicide or palladium silicide.

23. The non-linear type device capable of resonance tunnel phenomenon of claim 1, wherein said semiconductor is positioned between said electrodes and held parallel to the spreading direction of the laminated layers.

24. A non-linear type device capable of resonance tunnel phenomenon comprising a semiconductor and electrodes, said semiconductor including alternating laminated insulating and conductive layers, each layer being made of an organic material, said insulating layer being a monomolecular film or monomolecular built-up film layer of an organic compound wherein said organic compound is a charge transfer complex having an insulating, hydrophobic part and a conductive hydrophilic part in combination, and wherein said semiconductor is positioned between said electrodes and held parallel to the spreading direction of the laminated layers, and wherein a third electrode is connected electrically to the conductive layer in the semiconductor.

25. The non-linear type device capable of resonance tunnel phenomenon of claim 5, wherein said conductive layer is a monomolecular film or a monomolecular built-up film.

26. The non-linear type device capable of resonance tunnel phenomenon of claim 25, wherein said conductive layer and said insulating layer are a monomolecular film or a monomolecular built-up film of an organic compound, the molecule of said organic compound having a hydrophilic part and a hydrophobic part.

27. The non-linear type device capable of resonance tunnel phenomenon of claim 26, wherein the molecule of said organic compound is a charge transfer complex having an insulating, hydrophobic part and a conductive, hydrophilic part.

28. The semiconductor device of claim 8, wherein said semiconductor is positioned between said electrodes and held parallel to the spreading direction of the laminated layers.

29. The semiconductor device of claim 28, wherein a third electrode is connected electrically to the conductive layer in the semiconductor.

30. The non-linear device capable of resonance tunnel phenomenon of claim 1, wherein said conductive layer is a monomolecular film or a monomolecular built-up film.

31. The semiconductor device according to claim 8, wherein said semiconductor device is a non-linear type device capable of resonance tunnel phenomenon.

32. The semiconductor device according to claim 4, wherein said semiconductor comprises a charge transfer complex.

33. The semiconductor device according to claim 4, wherein said complex comprises at least one organic material selected from the group consisting of tetracyanoquinodimethane and its derivatives, tetrathiafulvalene and its derivatives, and tetrathiatetracene and its derivatives.

34. The semiconductor device according to claim 4, wherein said insulating layer has a thickness ranging from 10 Å to 100 Å.

35. The semiconductor device according to claim 4, wherein said conducting layer has a thickness ranging from 3 Å to 50 Å.

36. The semiconductor device according to claim 4, wherein said semiconductor has a thickness ranging from 50 Å to 1,000 Å.

* * * * *

UNITED STATES PATENT AND TRADEMARK OFFICE
CERTIFICATE OF CORRECTION

PATENT NO. : 4,939,556  Page 1 of 7
DATED : July 3, 1990
INVENTOR(S) : KEN EGUCHI ET AL.

It is certified that error appears in the above-identified patent and that said Letters Patent is hereby corrected as shown below:

Title Page:

AT [56] REFERENCES CITED

Foreign Patent Documents,
"165111  12/1989  France ." should read
--165111  12/1985  France .--.

Other Publications,
"R.M. Metzgar et al.:" should read
--R.M. Metzger et al.:--;
"Retifiers:" should read --Rectifiers:-- and
"Journal of Molecular Under Electronics,"
should read --Journal of Molecular Electronics,--.

SHEET 5 OF 9

FIG. 11, "APPLIDE VOLTAGE" should read
--APPLIED VOLTAGE--.

COLUMN 2

Line 10, "made" should read --made on--.
Line 55, "diagramatically" should read
--diagrammatically--.
Line 66, "diagramatically" should read
--diagrammatically--.

COLUMN 3

Line 26, "diagramatically" should read
--diagrammatically--.

UNITED STATES PATENT AND TRADEMARK OFFICE
CERTIFICATE OF CORRECTION

PATENT NO. : 4,939,556
DATED : July 3, 1990
INVENTOR(S) : KEN EGUCHI ET AL.

It is certified that error appears in the above-identified patent and that said Letters Patent is hereby corrected as shown below:

COLUMN 4

Line 16, "example;" should read --example:--.

COLUMN 5

Line 19, "TCNO" should read --TCNQ--.
    Line 38, "example;" should read --example:--.

COLUMN 6

Line 42, "a ultra thin" should read --an ultra-thin--.

COLUMN 7

Line 17, "these part" should read --these parts--.

COLUMN 8

Line 6, "are" should read --is--.

COLUMN 9

Line 11, "60 angstromes" should read --60 angstroms--.

COLUMN 10

Line 3, "Is" should read --is--.

UNITED STATES PATENT AND TRADEMARK OFFICE
CERTIFICATE OF CORRECTION

PATENT NO. : 4,939,556
DATED : July 3, 1990
INVENTOR(S) : KEN EGUCHI ET AL.

It is certified that error appears in the above-identified patent and that said Letters Patent is hereby corrected as shown below:

COLUMN 11

Line 3, "constitutIng" should read --constituting--.
Line 27, "super lattice" should read --super-lattice--.
Line 51, "hetero-super lattice" should read --hetero-super-lattice--.
Line 55, "semi conductivity)" should read --semi-conductivity)--.
Line 61, "super lattice" should read --super-lattice--.
Line 65, "realize" should read --realized--.
Line 67, "twice" should read --two--.

COLUMN 12

Line 1, "super lattice" should read --super-lattice--.
Line 29, "GaP CdS" should read --GaP, CdS--.

COLUMN 13

Line 23, "aliphetic" should read --aliphatic--.
Line 48, "designate" should read --designates--.
Line 66, "built-up" should read --build-up--.

COLUMN 14

Line 1, "controlability," should read --controllability,--.

COLUMN 15

Line 1, "EXAMPLE 2 TO 15" should read --EXAMPLES 2 TO 15--.

UNITED STATES PATENT AND TRADEMARK OFFICE
CERTIFICATE OF CORRECTION

PATENT NO. : 4,939,556

DATED : July 3, 1990

INVENTOR(S) : KEN EGUCHI ET AL.

It is certified that error appears in the above-identified patent and that said Letters Patent is hereby corrected as shown below:

COLUMN 17

Line 35, "170°C.," should read --17°C.,--.

COLUMN 18

Line 27, "$CH_3(-CH_2)_{11}C=C-C=C(-CH_2)-$" should read --$CH_3-(-CH_2-)_{11}C=C-C=C-(-CH_2-)$---.
Line 45, "a fresh" should read --afresh--.
Line 64, "build up" should read --built up--.

COLUMN 20

Line 67, "$(CH_3(CH_2)_{18}COO^-)_2Cd^{2+}])$," should read

--$(CH_3(CH_2)_{18}COO^-)_2Cd^{2+})]$,--.

COLUMN 21

Line 23, "build u" should read --build up--.
Line 43, "four layer" should read --four-layer--.
Line 67, "$C_{12}H_{25}-C=C-C=C-CH_2)_8COOH$" should read
--$C_{12}H_{25}-C=C-C=C-(-CH_2-)_8COOH$--.

UNITED STATES PATENT AND TRADEMARK OFFICE
CERTIFICATE OF CORRECTION

PATENT NO. : 4,939,556

DATED : July 3, 1990

INVENTOR(S) : KEN EGUCHI ET AL.

It is certified that error appears in the above-identified patent and that said Letters Patent is hereby corrected as shown below:

COLUMN 22

Line 9, " 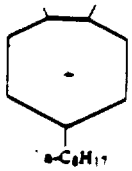 " should read -- 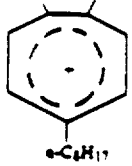 --.

Line 55, "Film" should read --film--.
Line 61, insert heading --TABLE 3--.

COLUMN 23

Line 29, "In" should read --in--.
Line 34, "thiner" should read --thinner--.
Line 68, "take out" should read --take-out--.

COLUMN 24

Line 16, "singal source $V_{in}$" should read "signal source $V_{in}$--.
Line 41, "cross sectional" should read --cross-sectional--.
Line 53, "was peeled" should be deleted.
Line 63, "Was" should read --was--.

COLUMN 25

Line 40, "bis" shoudl read --bis---.
Line 68, "1,000 Å))" should read --1,000 Å)--.

UNITED STATES PATENT AND TRADEMARK OFFICE
CERTIFICATE OF CORRECTION

PATENT NO. : 4,939,556

DATED : July 3, 1990

INVENTOR(S) : KEN EGUCHI ET AL.

It is certified that error appears in the above-identified patent and that said Letters Patent is hereby corrected as shown below:

COLUMN 26

Line 38, "Was" should read --was--.
    Line 50, "ODTCNO-TMTTF" should read --ODTCNQ-TMTTF--.
    Line 52, "build up." should read --built up.--.
    Line 66, "super lattice" should read --super-lattice--.

COLUMN 27

Line 43, "$[F_4\text{-}TCQN]_3^{2\ominus}$" should read --$[F_4\text{-}TCNQ]_3^{2\ominus}$--.

COLUMN 29

Line 17, "molecular film" should read --monomolecular film--.
    Line 32, "said semicon-" should be deleted.
    Line 33, "ductor," should be deleted.

COLUMN 30

Line 3, "pound the" should read --pound, the--.
    Line 9, "layers" should be deleted and insert --and--.
    Line 16, "20 Å" should read --10 Å--.

COLUMN 31

Line 23, "non-linear device" should read --non-linear type device--.

UNITED STATES PATENT AND TRADEMARK OFFICE
CERTIFICATE OF CORRECTION

PATENT NO. : 4,939,556

DATED : July 3, 1990

INVENTOR(S) : KEN EGUCHI ET AL.

It is certified that error appears in the above-identified patent and that said Letters Patent is hereby corrected as shown below:

COLUMN 32

Line 19, "conducting layer" should read --conductive layer--.

Signed and Sealed this

Fifth Day of January, 1993

Attest:

DOUGLAS B. COMER

Attesting Officer

Acting Commissioner of Patents and Trademarks